(12) United States Patent
Chuang et al.

(10) Patent No.: US 7,342,287 B2
(45) Date of Patent: Mar. 11, 2008

(54) POWER GATING SCHEMES IN SOI CIRCUITS IN HYBRID SOI-EPITAXIAL CMOS STRUCTURES

(75) Inventors: Ching-Te Chuang, South Salem, NY (US); Koushik K. Das, Yorktown Heights, NY (US); Shih-Hsien Lo, Mount Kisco, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/184,244

(22) Filed: Jul. 19, 2005

(65) Prior Publication Data

US 2007/0018248 A1    Jan. 25, 2007

(51) Int. Cl.
*H01L 27/092* (2006.01)

(52) U.S. Cl. .................. 257/392; 257/350; 257/369; 257/E27.064

(58) Field of Classification Search ............. 257/350, 257/392, 369, E27.064
See application file for complete search history.

(56) References Cited

U.S. PATENT DOCUMENTS

| | | | | |
|---|---|---|---|---|
| 5,869,872 | A * | 2/1999 | Asai et al. | 257/360 |
| 6,670,677 | B2 * | 12/2003 | Choe et al. | 257/355 |
| 6,972,478 | B1 * | 12/2005 | Waite et al. | 257/627 |
| 2003/0218231 | A1 | 11/2003 | Sani et al. | |
| 2006/0170045 | A1 * | 8/2006 | Yan et al. | 257/347 |
| 2006/0175659 | A1 * | 8/2006 | Sleight | 257/347 |

OTHER PUBLICATIONS

S. V. Kosonocky, et al., "Enhanced Multi-Threshold (MTCMOS) Circuits Using Variable Well Bias", pp. 165-169.
Shin'ichiro Mutoh, et al., "1-V Power Supply High-Speed Digital Circuit Technology with Multithreshold-Voltage CMOS", *IEEE Journal of Solid-State Circuits*, vol. 30, No. 8, Aug. 1995, pp. 847-854.
Koushik K. Das, et al., "Novel Ultra Low-Leakage Power Circuit Techniques and Design Algorithms in PD-SOI for Sub-1 V Applications", *2002 IEEE, International SOI Conference*, Oct. 2002, pp. 88-90.
Mario R. Casu, et al., "Synthesis of Low-Leakage PD-SOI Circuits with Body-Biasing", pp. 287-290.
M. Yang V. Chan, "On the Integration of CMOS with Hybrid Crystal Orientations".
M. Yang, M. leong, "High Performance CMOS Fabricated on Hybrid Substrate with Different Crystal Orientations".

* cited by examiner

*Primary Examiner*—Evan Pert
*Assistant Examiner*—Victor A. Mandala, Jr.
(74) *Attorney, Agent, or Firm*—Scully, Scott, Murphy & Presser, P.C.; Satheesh K. Karra

(57) ABSTRACT

Disclosed are a multi-threshold CMOS circuit and a method of designing such a circuit. The preferred embodiment combines an MTCMOS scheme and a hybrid SOI-epitaxial CMOS structure. Generally, the logic transistors (both nFET and pFET) are placed in SOI, preferably in a high-performance, high density UTSOI; while the headers or footers are made of bulk epitaxial CMOS devices, with or without an adaptive well-biasing scheme. The logic transistors are based on (100) SOI devices or super HOT, the header devices are in bulk (100) or (110) pFETs with or without an adaptive well biasing scheme, and the footer devices are in bulk (100) NFET with or without an adaptive well biasing scheme.

20 Claims, 5 Drawing Sheets

POWER GATING SCHEMES IN SOI CIRCUITS IN HYBRID SOI-EPITAXIAL CMOS STRUCTURES

STATEMENT REGARDING FEDERAL SPONSORED RESEARCH OR DEVELOPMENT

This invention was made with Government support under Contract No.: (NBCH30390004) awarded by DARPA. The Government has certain rights in this invention.

BACKGROUND OF THE INVENTION

1. Field of the Invention

This invention, generally, relates to Complementary Metal Oxide Semiconductor (CMOS) integrated circuits. More specifically, the invention relates to Multi-Threshold CMOS circuits capable of operating in active and standby modes.

2. Background Art

Modern Integrated Circuits (IC's) are designed to provide an enormous amount of functionality in a small area. Very large scale IC's are able to provide nearly all the functions required in many high-performance microprocessor designs and electronic devices. However, a significant portion of the total power consumption in high-performance digital circuits is due to leakage currents (both sub-threshold and gate). Besides, the ability to incorporate vast processing power and multiple functions has made IC's nearly indispensable in portable electronic devices. Portable electronic devices, such as a notebook computers, personal digital assistants, and cellular phones require IC's that have the ability to perform highly complex tasks. Portable electronic device designers, in turn, are committed to increasing the functionality of the device while reducing its physical size.

One method of increasing the functionality of a portable electronic device is to increase the number of functions performed by the IC's. However, in order to keep the size of the IC from becoming prohibitively large, IC designers have been decreasing the physical size of the transistors used in the circuit design. The dimensions of the transistors used in a typical IC are limited by the techniques used to create them. Presently, IC transistors have dimensions on the order of sub-microns. For example, in sub-micron IC technology, the length (L) of a Metal Oxide Semiconductor (MOS) transistor may be less than 1 µm.

The physical size of portable electronic devices cannot be decreased merely by incorporating more functionality into the IC's. Increases in the complexity and functionality of the IC scales the power consumption of the IC proportionally. Because most portable electronic devices are battery powered, power consumption plays an important part in determining the useful operational time of a portable device. Increasing the capacity of the battery may increase the operational time of a portable device, however, this option is in conflict with the desire to decrease the physical size and weight of portable devices. Thus, there is a corresponding need to reduce the power consumed in the portable electronic device. Decreasing the power consumption allows the designer to incorporate a battery having smaller capacity, and typically smaller physical size.

The IC designer is thus tasked with increasing the complexity of the IC while simultaneously decreasing the power consumption. One manner of decreasing the power consumed by the IC is by judicious selection of the type of technology used in implementing the IC. An IC may be implemented using a variety of technologies. For example, circuits may be implemented using bipolar transistors, Metal Oxide Semiconductor (MOS) transistors, NMOS transistors, and Complementary MOS (CMOS) transistors. CMOS transistor implementations are particularly favored in digital designs because a CMOS gate, theoretically, consumes no power in a static state.

Power is consumed by a CMOS circuit when the circuit switches between logic states. A significant reduction in CMOS power consumption can be achieved by reducing the power supply voltage to the circuits. Doing this, however, adversely affects the propagation delays of CMOS circuits, degrading the ability of the CMOS gate to function in a high speed circuit.

Power consumption of CMOS circuits can also be reduced without greatly degrading the high speed characteristics of the circuit by implementing both high threshold voltage transistors along with low threshold voltage transistors onto the same IC design. These circuits are referred to as Multi-Threshold CMOS (MTCMOS) circuits.

Previous MTCMOS implementations have connected the low threshold voltage circuits to virtual power supply lines and virtual voltage common lines. The virtual power supply and voltage common lines are electrically connected to the actual power supply or voltage common lines using high threshold power transistors. During active modes, the high threshold voltage power transistors are conducting and connect the low threshold voltage transistors to the actual power supply line and the actual voltage common line. During stand by modes, the high threshold voltage power transistors are turned off. The virtual power supply lines are effectively shut off, thus shutting down all of the low threshold voltage transistors connected to the virtual power supply lines.

Multi-threshold CMOS (MTCMOS) is a very efficient technique for controlling standby leakage. It uses a high threshold MOS device to de-couple the logic from the supply or ground during long idle periods, or standby states. The main concern in the implementation of MTCMOS scheme is the trade-off among standby leakage power, increased area, process/mask complexity, and active mode performance.

Active body biasing has been proposed to enhance MTCMOS scheme for bulk CMOS and partially depleted SOI (PD-SOI) circuits. For bulk CMOS, the triple well technology is required. For SOI, this scheme is only suited to thick silicon film SOI. Forming adequate body ties is becoming challenging and requires additional masking layers and implants to avoid creating a fully depleted region in the body tie structure, which would result in an open circuit to the body. The silicon thickness in scaled SOI devices has been aggressively scaled to reduce the junction capacitance and for better short channel control. For the silicon film down to 7-15 nm, it becomes almost impossible to offer body-contact in SOI. Furthermore, the area penalty to have a body contact to an SOI device is quite significant.

Recently a hybrid CMOS structure for body ties in ultra-thin SOI has been proposed. That proposal offers a hybrid CMOS structure that has both UTSOI CMOS and bulk CMOS FETs. The bulk CMOS FETs would be used in circuit application where well-bias scheme is applied and Vt tolerance is important. Furthermore, several technology approaches such as double SIMOX bonded HOT substrate, have been proposed to implement both (100) SOI nFETs and (110) SOI pFETs on one wafer, which is called "super HOT".

Also proposed recently is a high-performance high-$V_T$, thick-oxide pFET header in hybrid orientation technology, where the higher mobility of (110) pFET is utilized to enhance the performance of the pFET header. In that scheme, one of the devices (say NFET) is placed in SOI, while the other (i.e. pFET) is placed in the epitaxial layer, or vice versa. So, the logic transistors consist of mixed SOI-epitaxial devices. As such, the "bulk" device on the epitaxial layer suffers from added junction capacitances and reverse-body effect in stacked or pass-transistor configurations, thus degrading the performance of the logic circuits. Furthermore, the pFET header device is in the same substrate as all the logic pFETs. If the pFETs are in the epitaxial layer, it would be impractical to apply body/well bias to the header pFETs since it is difficult to isolate the well for the header pFETs. If the pFETs are in SOI, individual body bias can be applied to the header pFETs. However, the area penalty associated with individual body contacts can be significant. Moreover, for ultra-thin SOI (UTSOI), it would be impossible to offer good/effective body contacts.

SUMMARY OF THE INVENTION

An object of this invention is to provide an improved power-gating scheme in SOI circuits in hybrid SOI-epitaxial CMOS structures.

Another object of the present invention is to implement multi-threshold CMOS in hybrid SOI-epitaxial CMOS structures.

A further object of the invention is to combine an MTCMOS scheme and a hybrid SOI-epitaxial CMOS structure in a way that is particularly well suited for ultra-thin SOI (UTSOI) circuits.

These and other objectives are attained by combining an MTCMOS scheme and a hybrid SOI-epitaxial CMOS structure. Generally, the logic transistors (both NFET and pFET) are placed in SOI, preferably in a high-performance, high density UTSOI; while the headers or footers are made of bulk epitaxial CMOS devices, with or without an adaptive well-biasing scheme.

With first and second embodiments of the invention, the logic transistors are based on (100) SOI devices, and the header devices are in bulk (100) or (110) pFETs with an n-type well tied to Vdd. In accordance with a third embodiment of the invention, an adaptive well-biasing scheme can be added to the (100) or (110) pFET headers. In a fourth embodiment of the invention, the logic transistors are provided with a (100) bulk nFET footer scheme; and in a fifth embodiment of the invention, this (100) bulk NFET footer scheme is provided with an adaptive well-biasing scheme In a sixth embodiment of the invention, the logic devices described above may be fabricated in super HOT, replacing conventional (100) SOI logic devices and further boosting the circuit performance.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
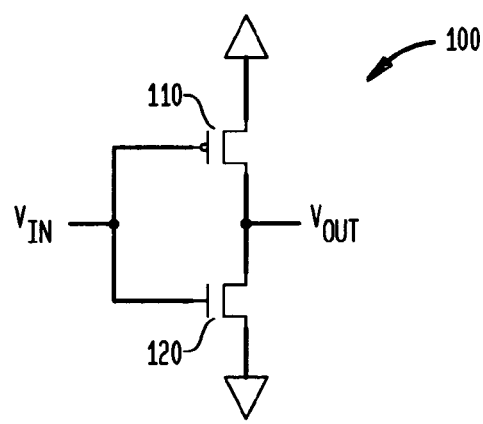
FIG. 1 is a functional diagram of a prior art CMOS inverter.

A diagram of a typical CMOS inverter 100 is shown in FIG. 1. CMOS technology uses both n-channel and p-channel circuits in the same chip. The source of an n-channel MOS transistor 120 is connected to a voltage return, which may also be referred to as a voltage common, voltage reference, voltage return, or a ground. It may be appreciated that the voltage return may also be one of the power supply lines. The voltage return provides the reference for a corresponding power supply line, Vdd. The voltage return may be isolated from other circuits or may be common to the voltage return used in other circuits. The gate of the n-channel MOS transistor 120 is electrically connected to the gate of a p-channel MOS transistor 110. The common gate connection also serves as the input to the CMOS inverter 100. The source of the p-channel MOS transistor 110 is electrically connected to the power supply line, Vdd. The drain of the p-channel circuit 110 is electrically connected to the drain of the n-channel circuit 120. The common drain connection is the output of the inverter 100.

The operation of the inverter 100 is relatively simple. When the input signal, Vin, is low, the n-channel transistor 120 does not conduct, or is cut-off. However, the p-channel circuit 110 is switched on such that the power supply voltage, Vdd, appears at the output, Vout, of the inverter 100. Alternatively, when the input signal, Vin, is high, the p-channel transistor 110 does not conduct and the n-channel circuit 120 is switched on, such that the output of the inverter 100 is pulled to voltage return. For each of the two states of the inverter 100, one transistor of the complementary transistor pair is non-conducting. The non-conducting transistor provides a high impedance path from the power supply line to voltage return, thus limiting the power dissipation of the inverter 100 when the output is static. The leakage current of the cut-off transistor largely determines the level of power dissipation in the static state.

In order to better utilize inherent performance characteristics of nFETs and pFETS, a technology referred to as Hybrid Orientation Technology (HOT) has been developed. Two HOT structures are possible: HOT-A, which is comprised of a pFET on (110) SOI and an NFET on (100) silicon epitaxial layer; and HOT-B, which is comprised of nFET on (100) SOI and a pFET on (110) silicon epitaxial layer.

Figure 2:
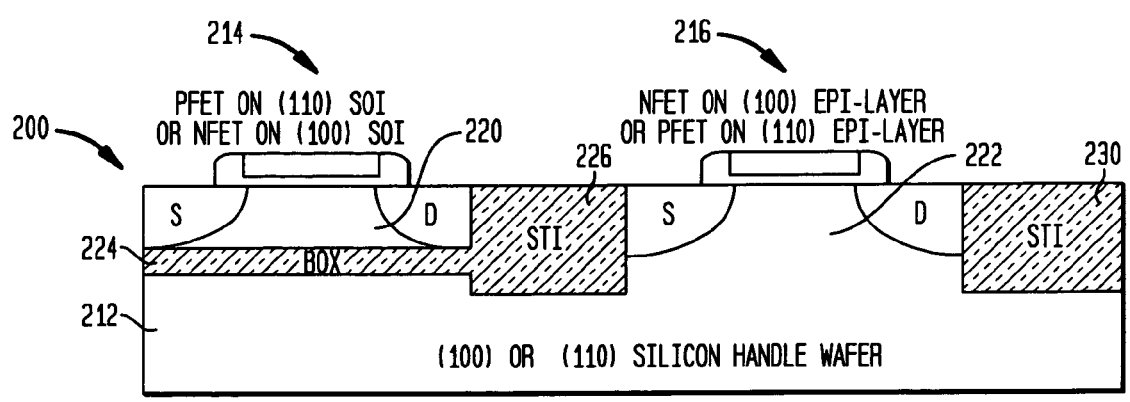
FIG. 2 is a schematic cross-section illustrating hybrid orientation technology (HOT).

FIG. 2 is a schematic cross-section illustrating hybrid orientation technology (HOT). More specifically, FIG. 2 shows a portion of a silicon wafer 200 comprising silicon substrate 212 and transistors 214 and 216. Each transistor includes source (S), drain (D) and gate (G) regions, with the source and drain regions separated by a channel region. The channel region of transistor 214 is referenced at 220, and the channel region of transistor 216 is referenced at 222. Beneath transistor 214 is a buried oxide (BOX) region 224, which separates the transistor from the silicon substrate 212. The channel region 222 between the source and drain of transistor 216 is not separated from the silicon substrate and instead is a direct extension of that substrate. A shallow-trench-isolation (STI) region 226 separates transistor 214 from transistor 216, and another STI region 230 is shown in FIG. 2, to the right of transistor 216.

One of the transistors 214 and 216 is a PFET and the other of these transistors is an NFET. When transistor 214 is a PFET and transistor 216 is an NFET, the structure is referred to as HOT-A; while when transistor 214 is an NFET and transistor 216 is a PFET, the structure is referred to as HOT-B. Also, in HOT, the NFET is identified by the numeric designation "100," and the PFET is identified by the numeric designation "110." Thus, when transistor 214 is a PFET it is referred to as PFET on (110) SOI; and when this transistor is an NFET, it is referred to as NFET on (100) SOI. When transistor 216 is an NFET, it is referred to as NFET on (100) epi-Layer; and when this transistor is a PFET, it is referred to as PFET (110) on epi-Layer.

As mentioned above, power consumption of CMOS circuits can be significantly reduced without greatly degrading the high speed characteristics of the circuit by implementing both high threshold voltage transistors along with low threshold voltage transistors onto the same IC design. These circuits are referred to as multi-threshold CMOS, or MTC-MOS, circuits. These circuits, more specifically, add a high VTH pFET header or a high VTH nFET footer device in series to a circuit to reduce leakage in standby mode.

Figure 3:
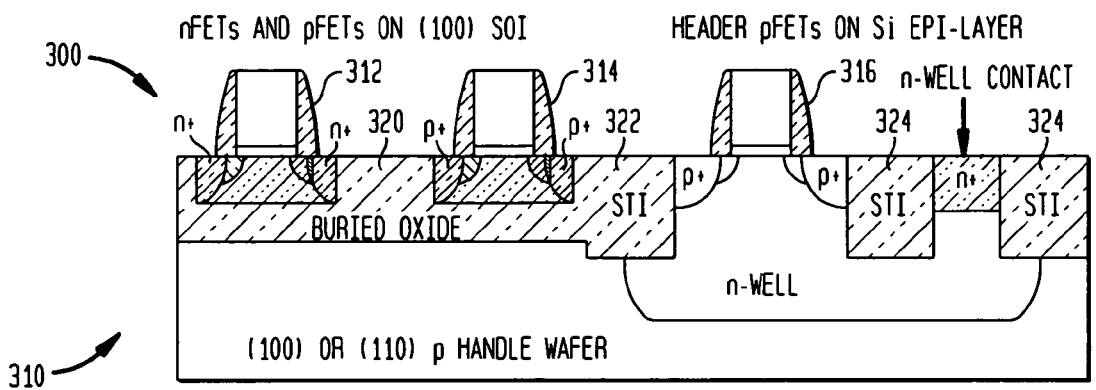
FIG. 3 is a schematic cross section showing multi-threshold CMOS structure in a hybrid SOI-epitaxial CMOS structure.

Also, as mentioned above, and with reference to FIGS. 3 and 4, for SOI technology, header/footer body biasing schemes have been proposed to boost MTCMOS performance. FIG. 3 shows a schematic cross-section of a bulk pFET header and (100) UTSOI logic devices, while FIG. 4 shows the case for super HOT logic devices.

More specifically, FIG. 3 shows a portion of a silicon wafer 300 comprising silicon substrate 310 and transistors 312, 314, 316. Transistor 312 is an nFET, while transistors 314 and 316 are pFETs. Each of the transistors includes a source, a drain and a gate region, with the source and drain regions separated by a channel region. Beneath transistors 312 and 314 is a buried oxide (BOX) region 320, which separates the transistor 312 and 314 from the silicon substrate 310. The channel region between the source and drain of transistor 316 is not separated from the silicon substrate 310 and instead is a direct extension of that substrate. A shallow-trench-isolation (STI) region 322 separates transistor 314 from transistor 316, and additional STI regions 324 are shown in FIG. 3, to the right of transistor 316.

Figure 4:
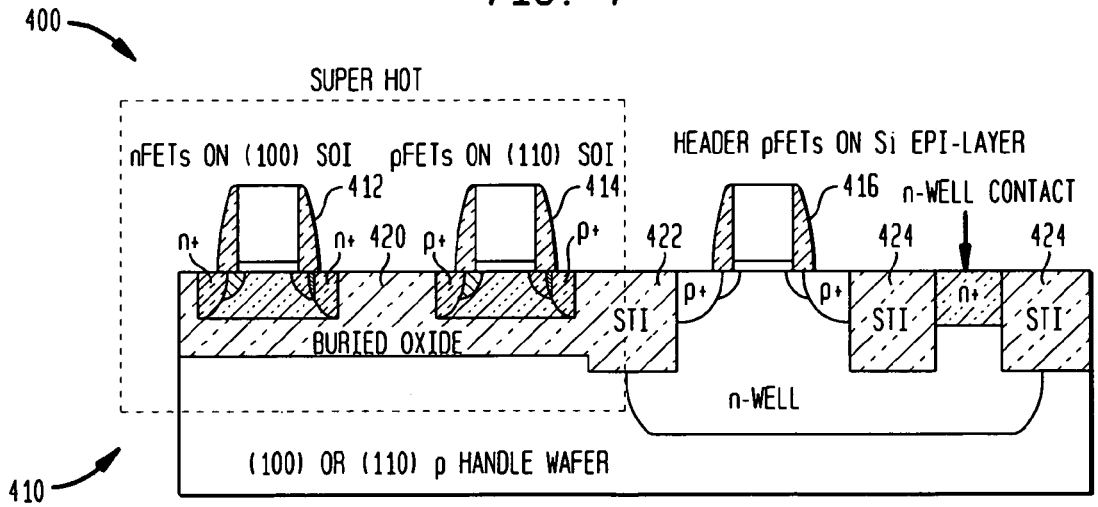
FIG. 4 is a schematic cross section showing a super HOT structure.

FIG. 4, similar to FIG. 3, shows a portion of a silicon wafer 400 comprising silicon substrate 410 and transistors 412, 414, 416. Transistor 412 is an nFET, while transistors 414 and 416 are pFETs. Each of the transistors includes a source, a drain and a gate region, with the source and drain regions separated by a channel region. Beneath transistors 412 and 414 is a buried oxide (BOX) region 420, which separates the transistor from the silicon substrate 410. The channel region between the source and drain of transistor 416 is not separated from the silicon substrate 410 and instead is a direct extension of that substrate. A shallow-trench-isolation (STI) region 422 separates transistor 414 from transistor 416, and additional STI regions 424 are shown in FIG. 4, to the right of transistor 416.

Figure 5:
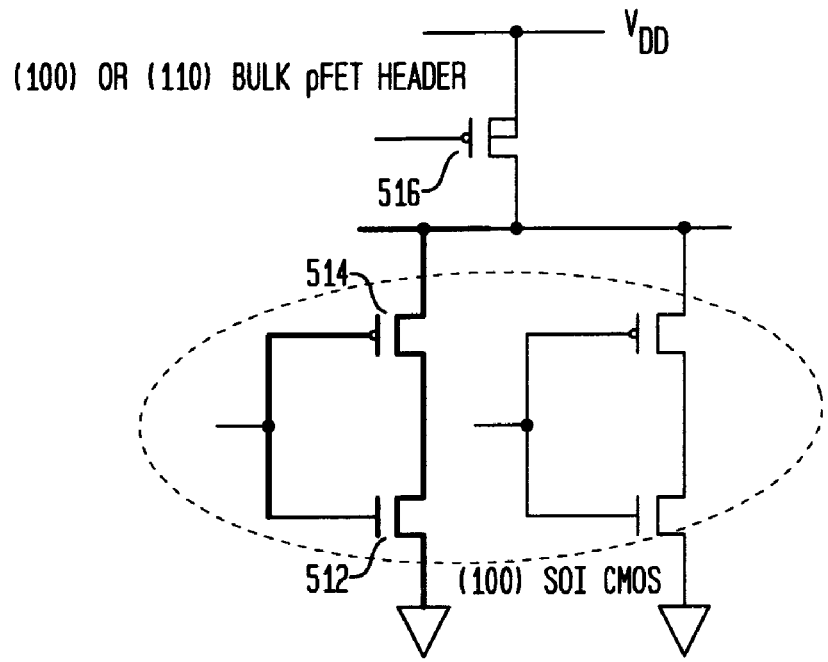
FIG. 5 illustrates first and second embodiments of the invention, which include a bulk pFET header scheme.

FIG. 5 illustrates first embodiment of the present invention, where the logic transistors 512 and 514 are based on (100) SOI devices, and the header devices 516 are in bulk (100) pFETs with an n-type well tied to Vdd. The header pFET automatically comes with higher bulk junction capacitance, which helps reducing Vdd bounce noise.

FIG. 5 also shows second embodiment of the present invention, where a (110) bulk pFET header scheme is used. (110) bulk pFETs can offer a higher drive current because of over two times hole mobility enhancement in that orientation.

Figure 6:
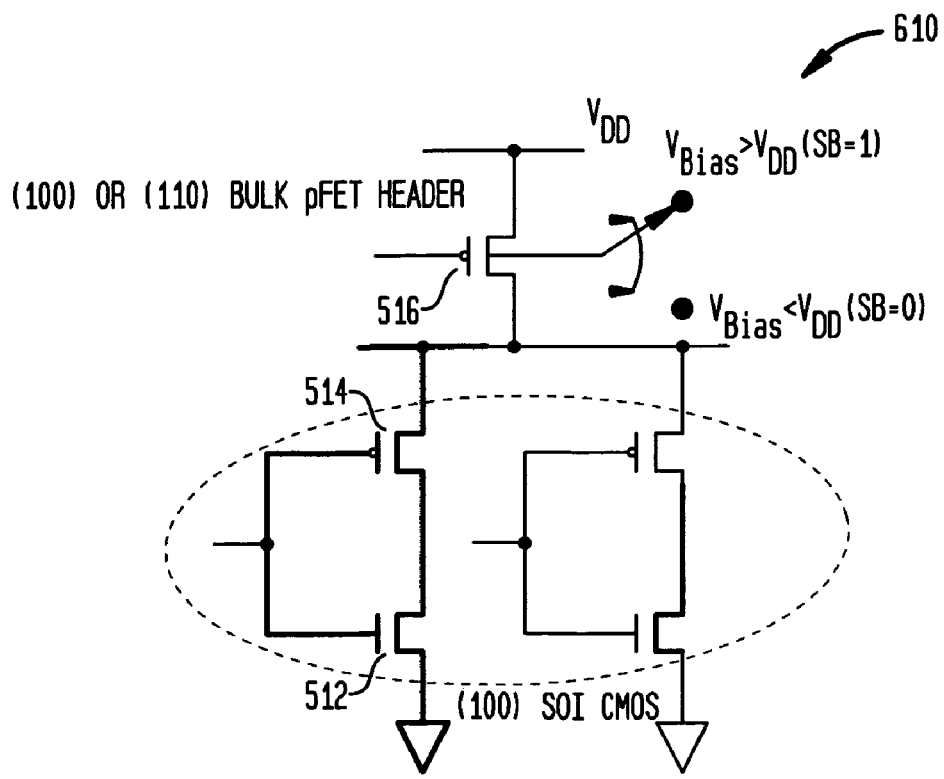
FIG. 6 shows a third embodiment of the invention, which includes an adaptive well-biasing scheme.

In accordance with a third embodiment of the invention, and as illustrated in FIG. 6, an adaptive well-biasing scheme 610 can be added to the (100) or (110) pFET headers. This well-biasing scheme helps further improving pFET ON current during active mode and reducing pFET OFF current during standby mode. The body contact for the bulk header is isolated from logic circuits by STI and buried oxide (BOX), so naturally the contact well can be unipolar. Different from bulk technology, there is no need to use expensive triple well technology to put logic pFETs and header pFETs in different well islands. Less area penalty resulting in high circuit density and less process steps are two major advantages over the conventional bulk CMOS or SOI CMOS schemes.

Figure 7:
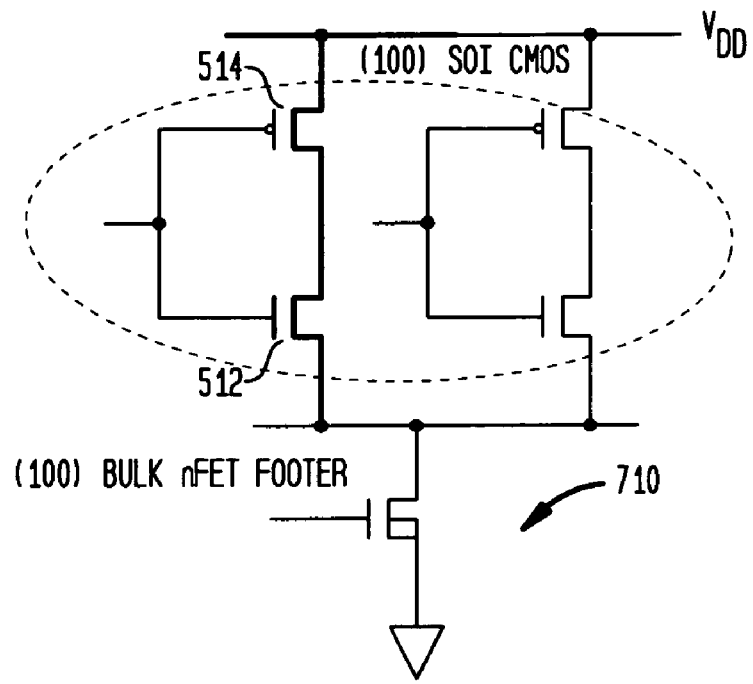
FIG. 7 shows a fourth embodiment of the invention, which includes a bulk nFET footer scheme.

With reference to FIG. 7, in accordance with a fourth embodiment of the invention, transistors 512 and 514 are provided with a (100) bulk nFET footer scheme 710. Again, the high junction capacitance associated with bulk nFET footer helps reduce virtual ground noise during switching.

Figure 8:
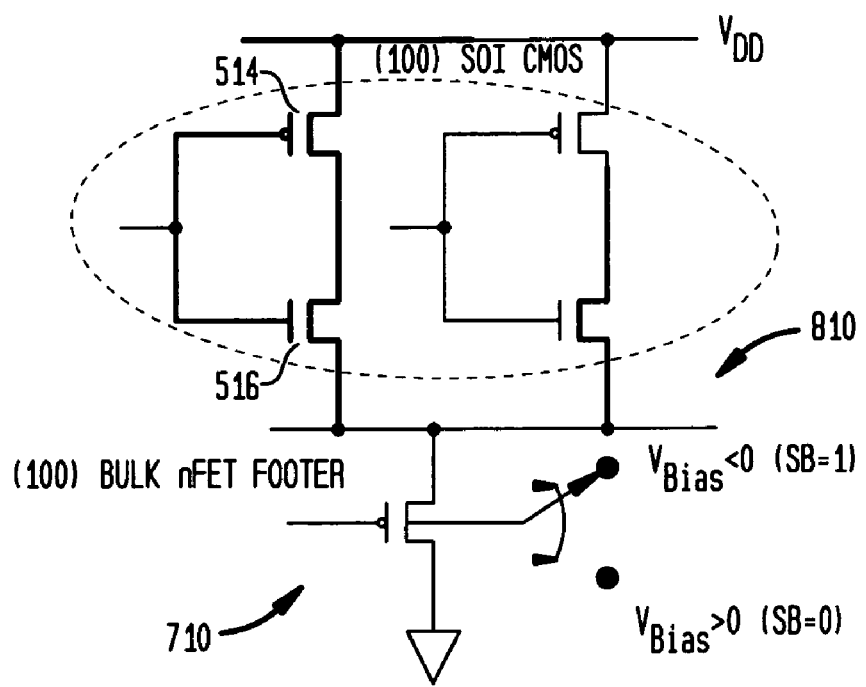
FIG. 8 illustrates a fifth embodiment of the invention, which includes a bulk NFET footer scheme with an adaptive well-biasing scheme.

As illustrated in FIG. 8, the (100) bulk nFET footer scheme of FIG. 7 may be provided, in accordance with a fifth embodiment of the invention, with an adaptive well biasing scheme 810. This well biasing scheme improves nFET ON current during active mode and reduces NFET OFF current during standby mode.

Also, in accordance with the present invention, the logic devices described above may be used in super HOT, replacing conventional (100) SOI logic devices used in the above-described first five embodiments of the invention.

Figure 9:
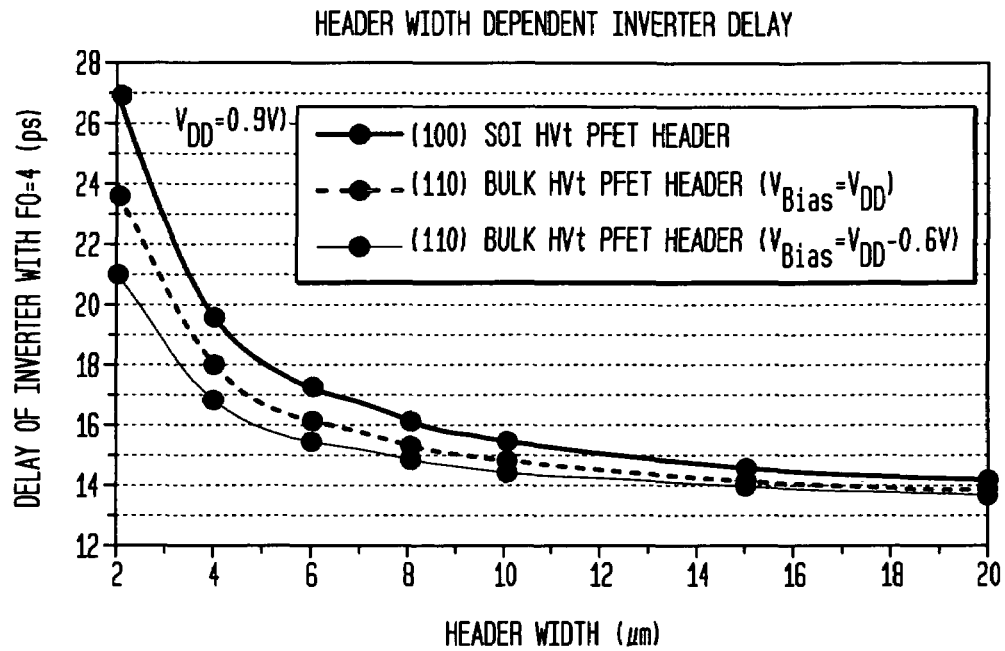
FIG. 9 shows the performance comparison between two (110) bulk pFET header schemes of the present invention and a conventional SOI pFET header scheme.

FIG. 9 shows the performance comparison between two proposed (110) bulk pFET header schemes and conventional SOI pFET header scheme. The threshold voltages of both bulk and SOI pFET headers are set to be 200 mV higher than those logic SOI pFETs. The results clearly demonstrate the significant performance advantage of the (110) bulk pFET scheme over the conventional SOI header. With a 0.6 V forward bias at n-well contact, bulk header case is improved even more.

Figure 10:
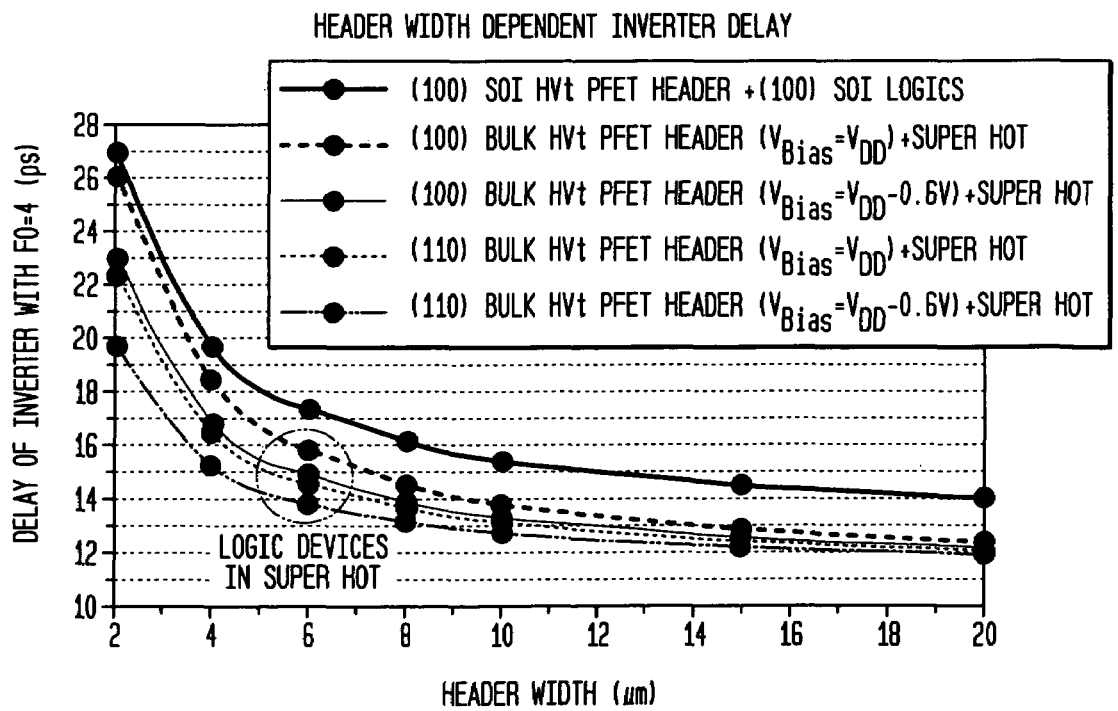
FIG. 10 shows the performance comparison between four bulk pFET header schemes of the present invention combined with logics in super HOT, and a conventional SOI pFET header scheme.

With usage of super HOT logic devices, the active mode performance can be improved further, as shown in FIG. 10.

The above-discussion disclosure describes a number of circuits that are implemented in MTCMOS such that they are capable of operation using low power supply voltages, such as 1 Volt. The disclosed circuits provide the high speed performance of a circuit that is implemented entirely using low threshold voltage CMOS, while maintaining the low leakage characteristics of a circuit implemented using solely with high threshold voltages CMOS circuits. The disclosed circuits are capable of being implemented using deep submicron (for example L<=0.18 µm) technology. It may be appreciated that a circuit designed in accordance with the invention may be incorporated into an IC, where an IC may refer to an Application Specific Integrated Circuit (ASIC), processor, programmable logic device, memory, or other circuit.

It may also be appreciated that a circuit designed in accordance with the invention may be used in a device such as a mobile phone, pager personal digital assistant, notebook computer, or any other electronic device that may benefit from a high performance, low voltage circuit that has low leakage and non-volatile data storage in sleep mode. For example, the circuit may be incorporated in a communication device having a radio frequency frontend coupled to a baseband processor. The circuit may be incorporated as part of the RF frontend or as part of the baseband processor. The baseband processor may also include a processor, Digital Signal Processor, memory, and other circuits. The communication device may be a wireless phone, pager, radio, or some other device.

While the above-discussed inventions are illustrated with static CMOS circuits, they can also be used with dynamic CMOS circuits and SRAMs (Static Random Access Memory) to achieve high performance with low leakage power.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A multi-threshold CMOS circuit comprising:
   a substrate including a silicon region;
   first and second low threshold voltage FETs in said substrate;
   said substrate further including an insulator region separating the first and second FETs from the silicon region;
   a third, high threshold voltage FET on said substrate and connected in series with the first and second FETs, said third FET being in direct contact with said silicon region;
   whereby the first, second and third FETs form a multi-threshold, hybrid SOI-epitaxial CMOS technology.

2. A multi-threshold CMOS circuit according to claim 1, wherein the third FET is a header FET, located in series between the first and second FETs and a voltage supply for the circuit.

3. A multi-threshold CMOS circuit according to claim 1, wherein the third FET is a footer FET, located in series between the first and second FETs and a ground connection for the circuit.

4. A multi-threshold CMOS circuit according to claim 1, further comprising an adaptive well biasing sub circuit connected to the third FET to bias said third FET in accordance with a defined procedure.

5. A multi-threshold CMOS circuit according to claim 1, wherein the first FET is an NFET, and the second FET is a pFET.

6. A multi-threshold CMOS circuit according to claim 1, wherein the third FET is an nFET.

7. A multi-threshold CMOS circuit according to claim 1, wherein the third FET is a pFET.

8. A multi-threshold CMOS circuit according to claim 1, wherein the substrate is a super HOT.

9. A multi-threshold CMOS circuit comprising:
   a substrate including a silicon region;
   first and second low threshold voltage FETs in said substrate, said first FET being an nFET, and said second FET being a pFET;
   said substrate further including an insulator region separating the first and second FETs from the silicon region;
   a third, high threshold voltage FET on said substrate and connected in series with the first and second FETs, said third FET being in direct contact with said silicon region;
   an adaptive well biasing subcircuit connected to the third FET to bias said third FET in accordance with a defined procedure.
   whereby the first, second and third FETs form a multi-threshold, hybrid SOI-epitaxial CMOS technology.

10. A multi-threshold CMOS circuit according to claim 9, wherein the third FET is a header pFET, located in series between the first and second FETs and a voltage supply for the circuit.

11. A multi-threshold CMOS circuit according to claim 9, wherein the third FET is a footer NFET, located in series between the first and second FETs and a ground connection for the circuit.

12. A multi-threshold CMOS circuit according to claim 9, wherein said substrate is a super HOT.

13. A method of designing a multi-threshold CMOS circuit comprising the steps of:
    providing a substrate including a silicon region;
    forming first and second low threshold voltage FETS on said substrate;
    forming an insulator region on the substrate for separating the first and second FETs from the silicon region;
    forming a third, high threshold voltage FET on the substrate and connected in series with the first and second FETs;
    directly connecting the third FET with the silicon region of the substrate;
    whereby the first, second and third FETs form a multi-threshold hybrid SOI-epitaxial CMOS technology.

14. A method according to claim 13, further comprising the step of providing a biasing subcircuit to bias the third FET in accordance with a defined procedure.

15. A method according to claim 13, wherein the third FET is a pFET header located in series between the first and second FETs and a power supply of the circuit.

16. A method according to claim 13, wherein the third FET is a nFET footer located in series between the first and second FETs and a ground connection of the circuit.

17. A method according to claim 13, wherein the substrate is a super HOT.

18. A method of forming a multi-threshold CMOS circuit, comprising:
    forming first and second FETs on a substrate having a silicon region, the first and second FETs having a first threshold voltage;
    separating the first and second FETs from the silicon region via an insulator;
    forming a third FET on the substrate, the third FET being connected in series with the first and second FETs, the third FET having a second threshold voltage; and
    directly connecting the third FET with the silicon region such that the first, second and third FETs form a multi-threshold CMOS circuit.

19. The method of claim 18, wherein the first threshold voltage is lower than the second threshold voltage, and further wherein the third FET is a pFET header located in series between the first and second FETs and a power supply of the circuit.

20. The method of claim 18, wherein the third FET is a nFET footer located in series between the first and second FETs and a ground connection of the circuit.

* * * * *